United States Patent [19]
Rohrbaugh et al.

[11] Patent Number: 5,905,986
[45] Date of Patent: May 18, 1999

[54] HIGHLY COMPRESSIBLE REPRESENTATION OF TEST PATTERN DATA

[75] Inventors: John G Rohrbaugh, Ft. Collins; Jeff Rearick, Fort Collins, both of Colo.

[73] Assignee: Hewlett-Packard Company, Palo Alto, Calif.

[21] Appl. No.: 08/779,760

[22] Filed: Jan. 7, 1997

[51] Int. Cl.[6] .................................................. G06F 17/30
[52] U.S. Cl. ........................................... 707/101; 707/100
[58] Field of Search ....................... 707/1–10, 100–104, 707/200–206, 506; 341/51, 64, 67, 87; 257/503, 537

[56] References Cited

U.S. PATENT DOCUMENTS

| | | | |
|---|---|---|---|
| 4,464,650 | 8/1984 | Eastman et al. | 341/51 |
| 5,025,396 | 6/1991 | Parks et al. | 707/506 |
| 5,128,737 | 7/1992 | Van Der Have | 257/503 |
| 5,546,575 | 8/1996 | Potter et al. | 707/101 |
| 5,703,581 | 12/1997 | Matias et al. | 341/67 |

OTHER PUBLICATIONS

"Submicron CMOS/BICMOS Gate Arrays", Release 2.0, Engineering Newsletter published by Texas Instruments, Oct. 1992.

*Primary Examiner*—Thomas G. Black
*Assistant Examiner*—Ruay Lian Ho

[57] ABSTRACT

A method for more efficient handling of data used in testing electronic integrated circuits and boards consisting of specifying data in a flat tabular format. Signal data are contained in columns and cycle data are contained in rows. Any given signal in a cycle will typically be a "0" or "1". If a signal does not change from one cycle to the next, the character "0" or "1" is replaced in the latter cycle by the dot "." character. As a result of the "." character replacements, the data is much more highly compressible by standard compression software than before, thus requiring less storage space for the data.

12 Claims, 8 Drawing Sheets

ALTERED TEST PATTERN DATA

SIGNAL

| TEST CYCLE | SIG1 | SIG2 | SIG3 | SIG4 |
|---|---|---|---|---|
| CYC1 | 0 | 0 | 0 | 0 |
| CYC2 | 1 | 1 | 1 | 1 |
| CYC3 | . | . | . | . |
| CYC4 | . | 0 | . | 0 |
| CYC5 | . | . | . | 1 |

FIG. 1

PRIOR ART

*FIG. 2A*

| TEST CYCLES | SIGNAL IN | | SIGNAL OUT |
|---|---|---|---|
| | $I_1$ | $I_2$ | $O_1$ |
| CYC1 | 0 | 0 | 0 |
| CYC2 | 0 | 1 | 0 |
| CYC3 | 1 | 0 | 0 |
| CYC4 | 1 | 1 | 1 |
| CYC5 | 0 | 0 | 0 |

PRIOR ART

CREATED TEST
PATTERN DATA
 SIGNAL

|  | SIG1 | SIG2 | SIG3 | SIG4 |
|---|---|---|---|---|
| TEST CYCLE | | | | |
| CYC1 | 0 | 0 | 0 | 0 |
| CYC2 | 1 | 1 | 1 | 1 |
| CYC3 | 1 | 1 | 1 | 1 |
| CYC4 | 1 | 0 | 1 | 0 |
| CYC5 | 1 | 0 | 1 | 1 |

*FIG. 7A*

ALTERED TEST
PATTERN DATA
 SIGNAL

|  | SIG1 | SIG2 | SIG3 | SIG4 |
|---|---|---|---|---|
| TEST CYCLE | | | | |
| CYC1 | 0 | 0 | 0 | 0 |
| CYC2 | 1 | 1 | 1 | 1 |
| CYC3 | • | • | • | • |
| CYC4 | • | 0 | • | 0 |
| CYC5 | • | • | • | 1 |

*FIG. 7B*

ALTERED TEST PATTERN DATA

| TEST CYCLE | SIG1 | SIG2 | SIG3 | SIG4 |
|---|---|---|---|---|
| CYC1 | 0 | 0 | 0 | 0 |
| CYC2 | 1 | 1 | 1 | 1 |
| CYC3 | • | • | • | • |
| CYC4 | • | 0 | • | 0 |
| CYC5 | • | • | • | 1 |

*FIG. 8A*

RESTORED TEST PATTERN DATA

| TEST CYCLE | SIG1 | SIG2 | SIG3 | SIG4 |
|---|---|---|---|---|
| CYC1 | 0 | 0 | 0 | 0 |
| CYC2 | 1 | 1 | 1 | 1 |
| CYC3 | 1 | 1 | 1 | 1 |
| CYC4 | 1 | 0 | 1 | 0 |
| CYC5 | 1 | 0 | 1 | 1 |

*FIG. 8B*

HIGHLY COMPRESSIBLE REPRESENTATION OF TEST PATTERN DATA

FIELD OF THE INVENTION

This invention relates to testing electronic integrated circuits and boards and more particularly to test pattern data. Even more particularly, the invention relates to more efficient management, compression, and storage of test pattern data.

BACKGROUND OF THE INVENTION

Integrated circuits are routinely tested to insure that they are functioning properly before a product containing the integrated circuit is shipped, sold, or placed into use. The time required for testing can vary from seconds to several minutes depending upon the particular integrated circuit, its complexity, and its function. Typically, test pattern data created for such testing purposes is often quite large and difficult to manage.

Various approaches have been taken in the art to better manage the large test pattern data required for testing integrated circuits. One solution has been to specify test pattern data for all signals on every cycle in a flat tabular format. Signals are associated with unique identifiers in columns. Cycles are associated with unique identifiers in rows. This format requires a large amount of storage space (the number of signals multiplied by the number of cycles). Applying standard compression software can reduce the size significantly, but this depends upon the data. Another disadvantage with this method is that it is difficult to see which signals are changing.

Another approach has been to specify the test pattern data only when the signal names and their associated values change. For each cycle, there are signal names having associated values. In the next cycle, only those signals and associated values that are different from the previous cycle are specified. This approach has great utility because signals in test pattern data for integrated circuits tend not to change much between cycles. However, this format takes more time to process, as the signal names must be processed each time the data changes. Additionally, though this format is typically smaller than a flat format, it does not compress as well.

An approach taken by Texas Instruments for testing high complexity circuits employs a test description language which has special statements which simplify the description of test vectors for scan-testable circuits. The goal is to eliminate redundant information by only having to describe non-redundant information.

This approach, described in a test development engineering note, published in October 1992, describes allowing test pattern data to specify a vector string which can have a multitude of characters. One such character is a space character, which is used to signify that a pin in a current cycle has the most recently applied signal from the previous cycle. The use of this space character can reduce the repetitiveness of data being entered, however, because the test pattern data is intermixed with all other specification data in the file, the use of the space character does not significantly improve the compressibility of the file. Also, because of the intermix of test pattern data and commands, the test pattern data contained in the file described by Texas Instruments is not capable of being processed sequentially, line by line, to automatically process an existing file of test pattern data to create a more compressible file. Thus, the Texas Instrument approach is not designed for improving compressibility of test pattern data.

It is thus apparent that there is a need in the art for a better way to manage large amounts of test pattern data for testing integrated circuits. There is also a need in the art to more efficiently reduce the amount of storage space required for large amounts of test pattern data. There is further a need in the art for a better way to represent the test pattern data so that it will compress more efficiently than the current art. There is also a need in the art to store in a separate file header and other information so that only test pattern data itself is stored in the test pattern data file. The present invention meets these and other needs in the art.

SUMMARY OF THE INVENTION

It is an aspect of the present invention to better manage test pattern data for testing integrated circuits.

It is another aspect of the invention to reduce the amount of disk space required to store the test pattern data.

It is yet another aspect of the invention to improve the ability to visually see changing signals within test pattern data from test cycle to test cycle.

A further aspect of the invention is to specify test pattern data for a signal only when the signal changes from test cycle to test cycle in such a way that data compression of the test pattern data is improved.

A still further aspect of the invention is to process a signal name only once for all test cycles.

A further aspect of the invention is to specify the test pattern data using a pattern character to represent that a signal in the current test cycle has not changed from that same signal in the previous test cycle.

Another further aspect of the invention is to store in a separate file header and other information to allow the test pattern data file to be more efficiently sequentially processed.

The above and other aspects of the invention are accomplished in a system that specifies test pattern data for all signals on every cycle in a flat tabular format. The various signals, 1 to n, are stored as columns, and the test cycles, 1 to m, are stored as rows in the test pattern data file. The position of a character in a column corresponds to the signal name for that column stored in an associated header file. When a signal for any given n does not change from cycle m to cycle m+1, a pattern character, such as the dot "." character, is substituted in the m+7 row and n column position for the actual test data character found in the m row and n column. When a signal for any given n does change from cycle m to cycle m+1, the new test data character is placed in the m+1 row and n column position. This procedure is followed for the entire test pattern data.

Test pattern data for integrated circuits typically does not change significantly from test cycle to test cycle. As a result of applying the invention to the test pattern data, the data consists primarily of dots ("."). This data format, when processed by conventional data compression software, compresses much more efficiently than other flat tabular formats.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
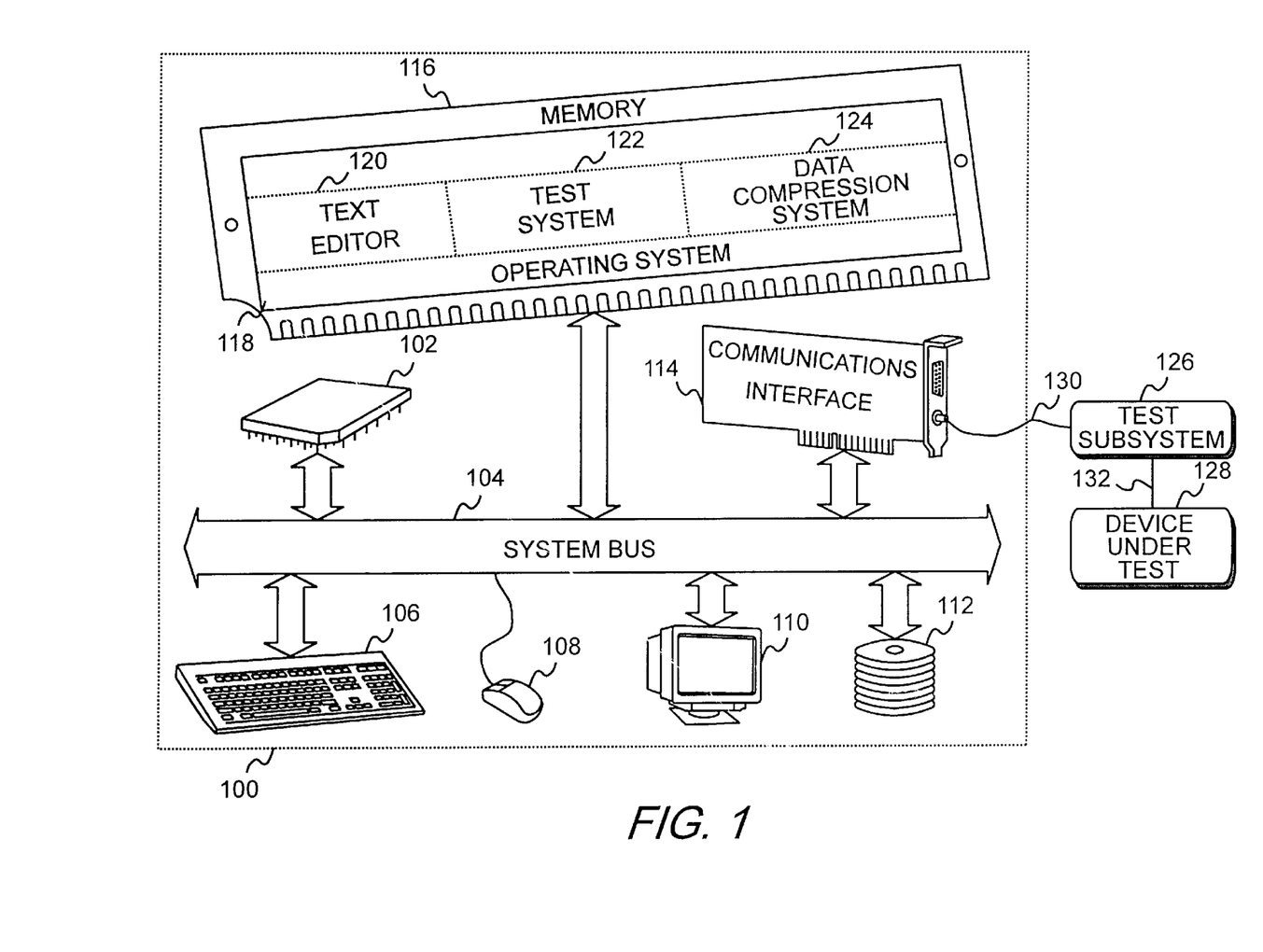
FIG. 1 shows a block diagram of a computer system and a test subsystem incorporating the present invention.

FIG. 1 shows a block diagram of a computer system and a test subsystem incorporating the present invention. Referring now to FIG. 1, a computer system 100 contains a processing element 102. The processing element 102 communicates to other elements of the computer system 100 over a system bus 104. A keyboard 106 allows a user of the computer system to input information into the computer system 100 and a graphics display 110 allows the computer system to output information to the user. A mouse 108 is also used to input information and a storage device 112 is used to store data and programs within the computer system 100. A memory 116, also attached to the system bus 104, contains an operating system 118, a text editor 120, a test system 122 of the present invention, and a data compression system 124. A communications interface 114 is also attached to the system bus 104. Test subsystem 126 is connected by cable 130 to communications interface 114. Test subsystem 126 is connected by connection 132, such as a "bed of nails" or a probe card, to a device under test 128.

Figure 2A:
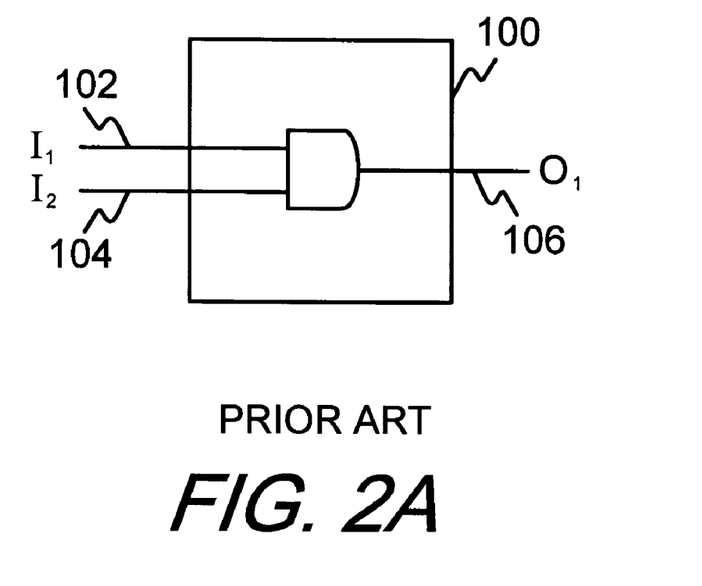
FIG. 2(a) shows a simple "and" circuit found in the prior art.
Figure 2B:
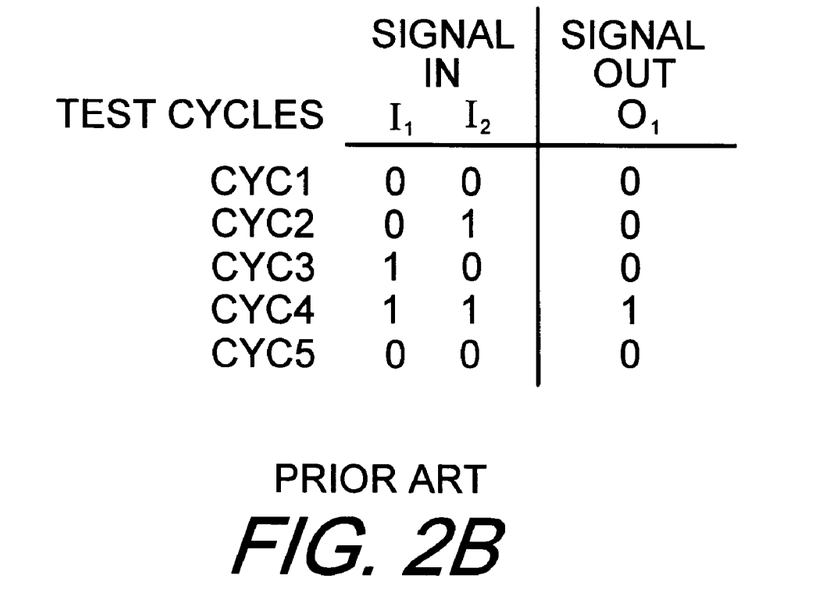
FIG. 2(b) shows a table of signal inputs and outputs for a simple "and" circuit found in the prior art.

FIG. 2(a) shows a simple prior art "and" circuit typical of many such circuits found in an integrated circuit, such as the device under test 128 (FIG. 1). Referring now to FIG. 2(a), "and" circuit 100 has two input signals, $I_1$ 102 and $I_2$ 104, and one output signal $O_1$ 106. FIG. 2(b) shows, in table format, a sample of signal inputs for $I_1$ and $I_2$, and the corresponding output $O_1$, over five test cycles.

Figure 3:
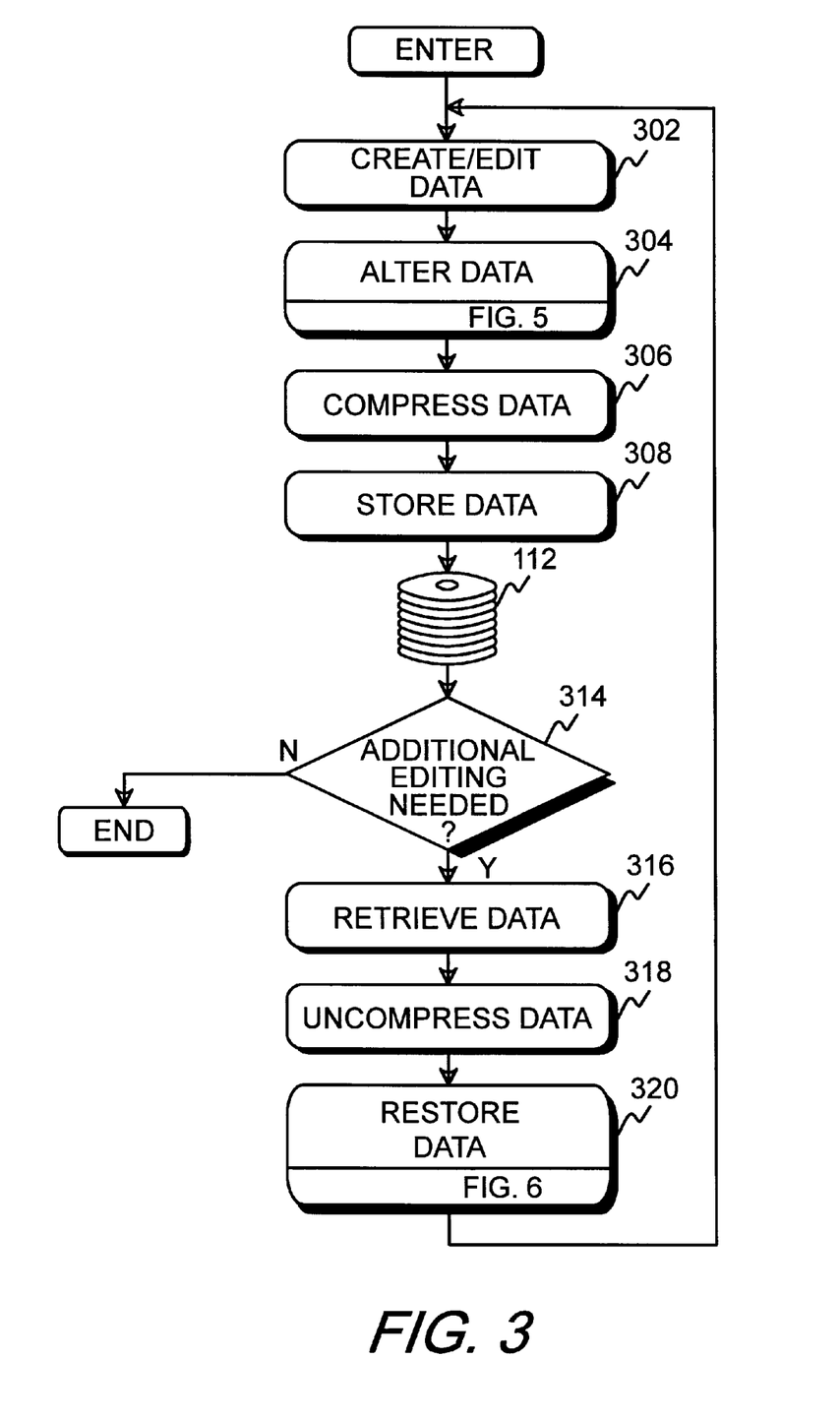
FIG. 3 shows a flow chart of the method of creating and editing test pattern data.

FIG. 3 shows a flow chart of test system 122 of the present invention. Referring now to FIG. 3, after entry, block 302 creates the test pattern data file for testing an integrated circuit. This might typically be done by using a conventional text editor, such as text editor 120 (FIG. 1). In the present invention, the signal names are placed in one file and the test pattern data is placed in a second file. The signal names correspond one to one with the columns of test data in the test pattern data file. Block 304 then calls FIG. 5 to alter the test data file created in block 302. Block 306 gets the altered test pattern data file and compresses it with standard, prior art, compression software such as data compression system 124 (FIG. 1). The compressed altered test pattern data file is stored by block 308 to storage device 112. In block 314 the user determines if the test pattern data needs editing. If the answer is no, the test pattern data creation ends. If the answer is yes, then block 316 retrieves the test pattern data from storage device 112. Block 318 decompresses the compressed altered test pattern data file with standard, prior art, compression software such as data compression system 124 (FIG. 1). Block 320 takes the decompressed altered test pattern data file and calls FIG. 6 to restore the altered test pattern data from the alterations made in block 304. Control then goes to block 302 for editing or refining of the test pattern data. This process is repeated through the flow chart as many times as necessary to get the test pattern data into the final form desired by the user.

Figure 4:
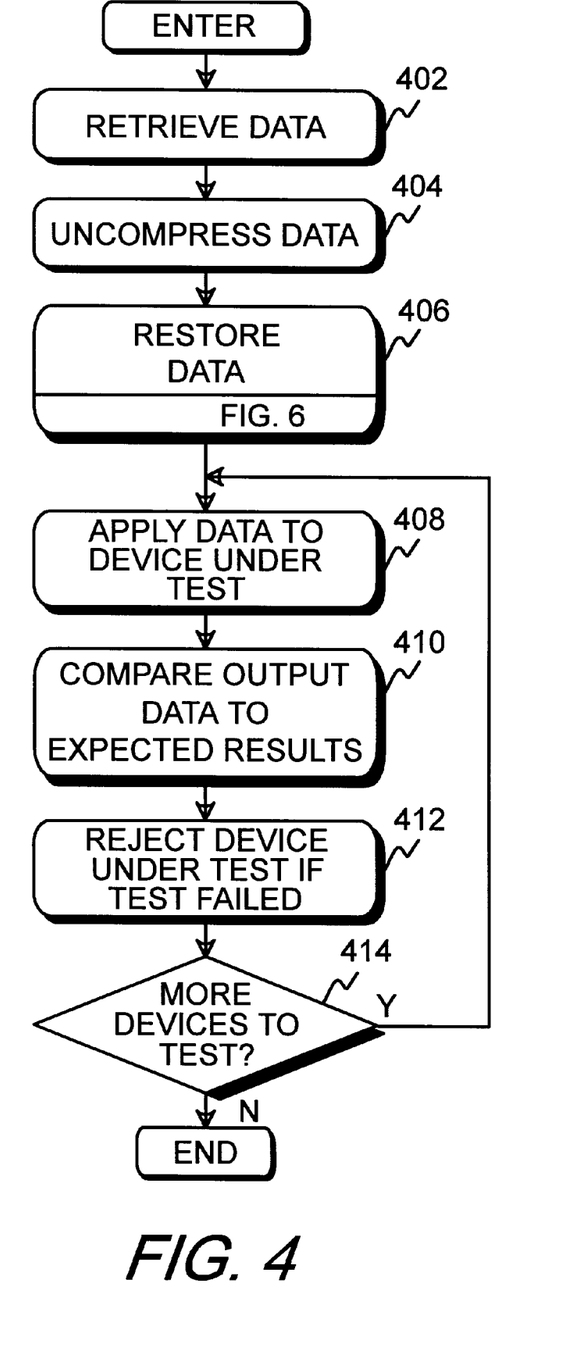
FIG. 4 shows a flow chart of the method of applying the test pattern data to a device under test.

FIG. 4 shows a flow chart of the method of applying the test pattern data to a device under test. Referring now to FIG. 4, block 402 retrieves the compressed altered test pattern data file from storage device 112. Block 404 decompresses the altered test pattern data file with standard, prior art, compression software such as data compression system 124 (FIG. 1). Block 406 takes the decompressed altered test pattern data file and calls FIG. 6 to restore the altered test pattern data from the alterations made in block 304 (FIG. 3). Block 407 translates the restored test pattern data file into the tester format and block 408 applies the translated data to the device under test. Block 410 compares the output data from applying the restored test pattern data to the device under test with the expected output. Block 412 then rejects the device under test if it failed the test. Block 414 determines if there is another device to be tested. Control either will end or pass back to block 408 to apply the restored test pattern data to the next device under test.

Figure 5:
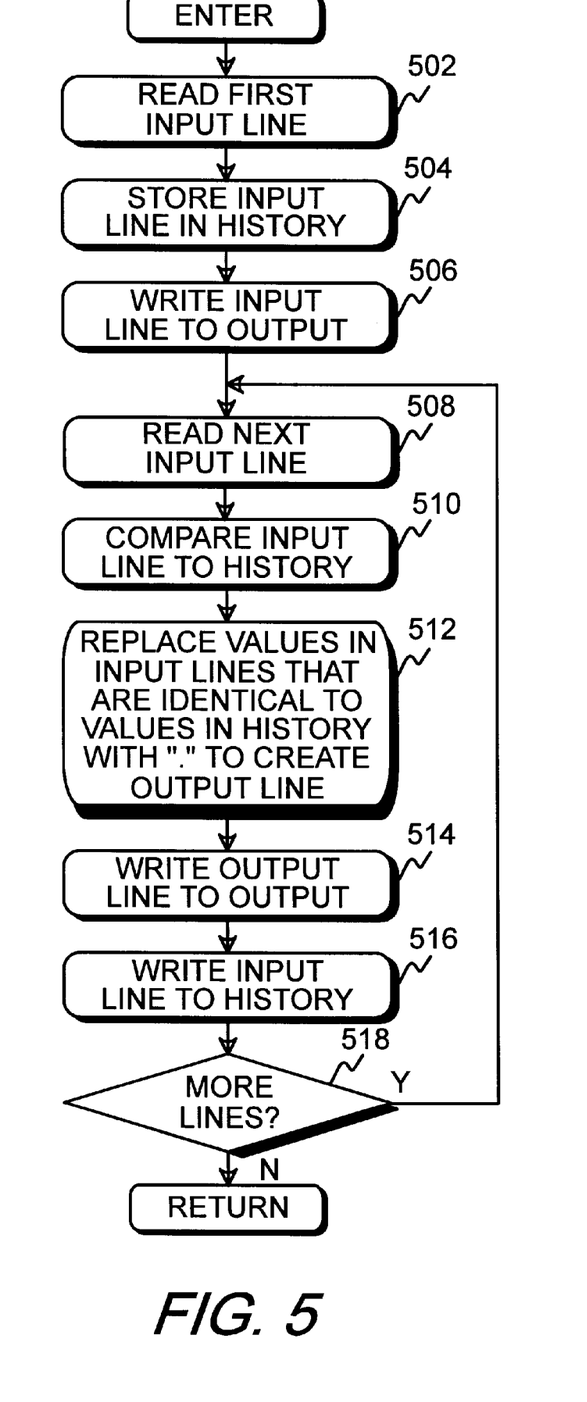
FIG. 5 shows a flow chart of the method of altering data of the present invention.

FIG. 5 shows a flow chart of the method of altering test pattern data of the present invention. Referring now to FIG. 5, block 502 reads the first input line of test pattern data. One skilled in the art will recognize that a line of input is often referred to as a record. Block 504 stores the input line in history. Block 506 writes the input line to output. Block 508 reads the next input line of test pattern data. Block 510 compares this input line to the line in history. Block 512 replaces characters in the input line that are identical to characters in the line in history with a dot character (".") to create an output line. Block 514 writes the output line to output. Block 516 writes the current input line to history. Block 518 determines if there is another line of test pattern data for input. If no, control returns to the calling routine, and if yes, control passes to block 508 to read the next line of input. This cycle repeats itself until there are no more lines of test pattern data for input.

Figure 6:
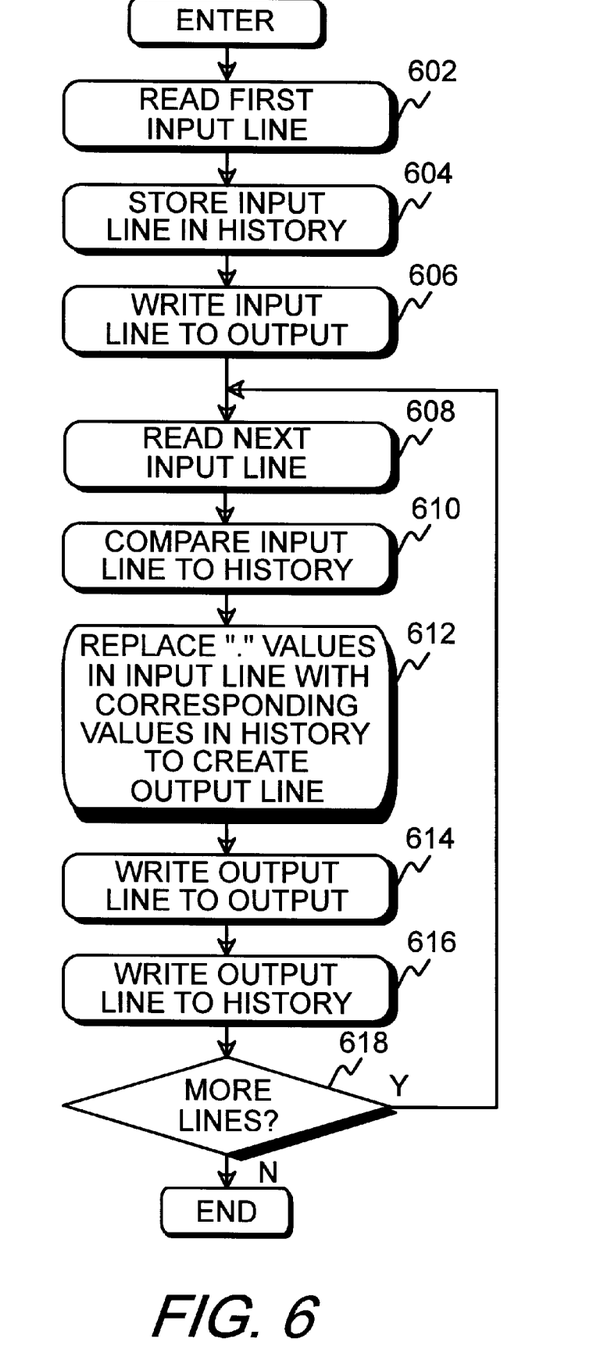
FIG. 6 shows a flow chart of the method of restoring altered data to its original form.

FIG. 6 shows a flow chart of the method of restoring altered test pattern data to its original form. Referring now to FIG. 6, block 602 reads the first input line of altered test pattern data. Block 604 stores the input line in history. Block 606 writes the input line to output. Block 608 reads the next input line of altered test pattern data. Block 610 compares this input line to the line in history. Block 612 replaces dot characters (".") in the input line with the corresponding character in the line in history to create an output line. Block 614 writes the output line to output. Block 616 writes the current output line to history. Block 618 determines if there is another line of test pattern data for input. If no, control returns to the calling routine, and if yes, control passes to block 608 to read the next line of input. This cycle repeats itself until there are no more lines of test pattern data for input.

Figure 7A:
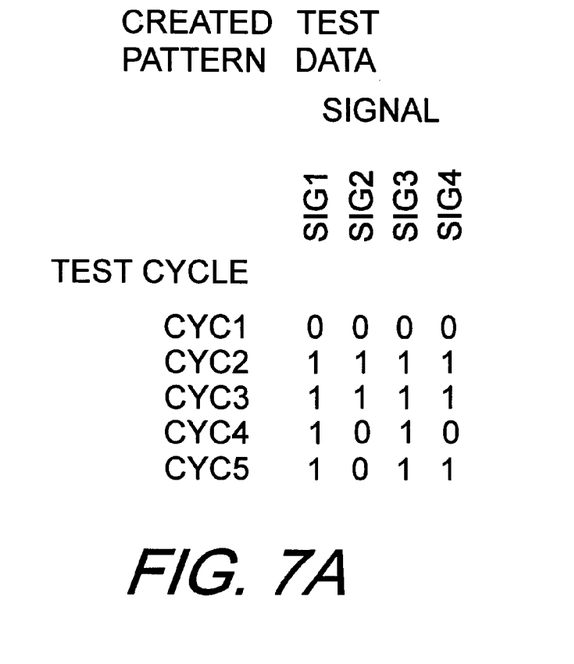
FIG. 7(a) shows a table of sample test pattern data for an example integrated circuit.

FIG. 7(a) shows a table of sample created test pattern data. Referring now to FIG. 7(a), the test pattern data is presented in a flat tabular format. The columns are individual signals specified as SIG1, SIG2, SIG3, and SIG4. The rows are individual cycles specified as CYC1, CYC2, CYC3, CYC4, and CYC5. During each cycle a character from each of the signals is passed. One skilled in the art will recognize that the signals may be expanded up to a SIGn and that the cycles may be expanded up to a CYCm. The character of any given signal in any given cycle will either be an ASCII "1" or an ASCII "0".

Figure 7B:
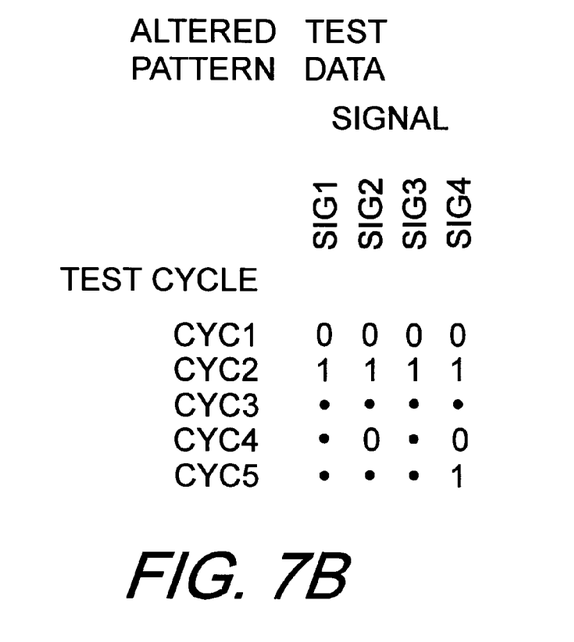
FIG. 7(b) shows a table of the results of altering the test pattern data of FIG. 7(a) using the method of FIG. 5.

FIG. 7(b) shows a resulting table of altered test pattern data from table 7(a). Referring now to FIG. 7(a) and FIG. 7(b), the characters of each signal during each cycle are evaluated and altered according to the following method, as also described above in FIG. 5. First, the characters contained in initial row CYC1 "0 0 0 0" in FIG. 7(a) are read from the created test pattern data file, put in history, and written without alteration to output as row CYC1 "0 0 0 0" as shown in FIG. 7(b). Next, the characters in row CYC2 from FIG. 7(a) "1 1 1 1" are read from the test pattern data file and compared to the characters in row CYC1 in history. Since every character in a column in row CYC2 is different from every character in a corresponding column in row CYC1, row CYC2 is written without alteration to output as row CYC2 "1 1 1 1" as shown in FIG. 7(b). CYC2 is stored in history replacing CYC1. Next, the characters in row CYC3 from FIG. 7(a) "1 1 1 1" are read from the test pattern data file and compared to the characters in row CYC2 "1 1 1 1" in history. In this case, the characters in row CYC3 did not change from the characters in row CYC2. The characters in row CYC3 "1 1 1 1" are replaced with a special ASCII character and written to output. Input row CYC3 "1 1 1 1" is stored in history replacing CYC2. In the preferred embodiment of the invention, the dot "." ASCII character is used because it is visually smaller than any other ASCII character and it compresses very well. One skilled in the art will recognize, however, that any one of a number of various ASCII characters could be used. Row CYC3 is altered to ". . . ." and written to output as shown in FIG. 7(b).

Next, the characters in row CYC4 "1 0 1 0" in FIG. 7(a) are read into input and compared to the characters in row CYC3 in history. In this case, the characters of SIG1 and SIG3 in row CYC4 are the same as SIG1 and SIG3 in row CYC3. The characters of SIG2 and SIG4 in row CYC4 are different from SIG2 and SIG4 in row CYC3. CYC4 is altered to ". 0 . 0" and written to output as row CYC4 as shown in FIG. 7(b). Input row CYC4 is stored in history replacing row CYC3.

Finally, row CYC5 "1 0 1 1" from FIG. 7(a) is read into input and compared to the characters in row CYC4 "1 0 1 0" in history. In this case, the characters of SIG1, SIG2, and SIG3 in row CYC5 did not change from the characters in SIG1, SIG2, and SIG3 in row CYC4. SIG4 in row CYC4 is different from SIG4 in row CYC5. CYC5 is written as ". . . 1" to output as shown in FIG. 7(b). Input row CYC5 is moved into history replacing row CYC4.

Figure 8A:
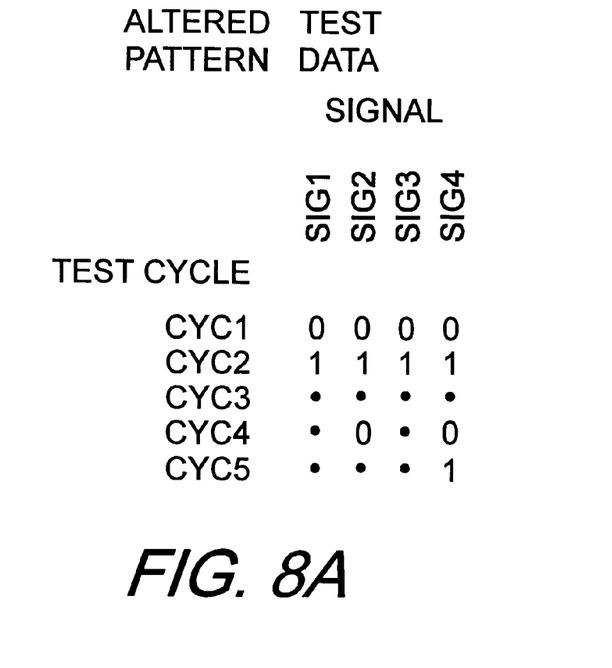
FIG. 8(a) shows a table of altered test pattern data.
Figure 8B:
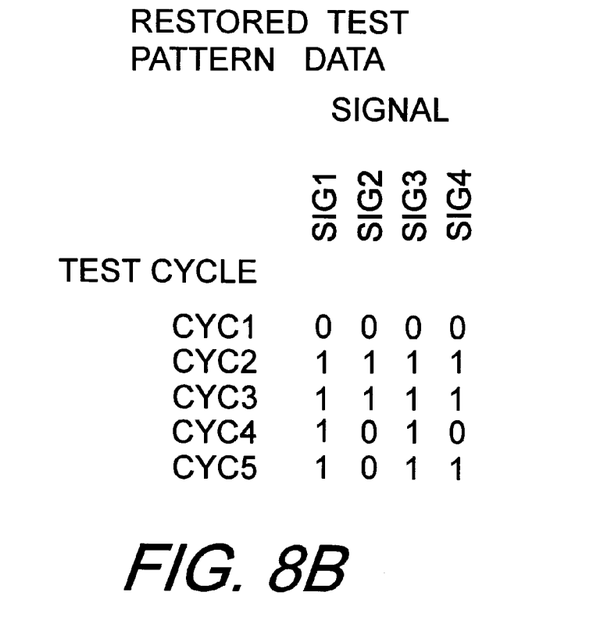
FIG. 8(b) shows a table of the results of restoring the altered test pattern data of FIG. 8(a) using the method of FIG. 6.

FIG. 8(a) shows a table of altered test pattern data and FIG. 8(b) shows a table of restored test pattern data from FIG. 8(a). The altered test pattern data is restored to its original form according to the following method, as also described above with respect to FIG. 6. Referring now to FIG. 8(a) and FIG. 8(b), the characters contained in row CYC1 "0 0 0 0" in FIG. 8(a) are read into input, stored in history, and written without alteration to output as row CYC1 "0 0 0 0" as shown in FIG. 8 (b). Next, the characters in row CYC2 "1 1 1 1" from FIG. 8(a) are read from the altered test pattern data file into input and compared to row CYC1 "0 0 0 0" in history. Since every character in a column in row CYC2 is different from every character in a corresponding column in row CYC1, CYC1 is replaced in history by CYC2, and row CYC2 is written without alteration to the restored test pattern data file as row CYC2 "1 1 1 1" as shown in FIG. 8(b). Next, the characters in row CYC3 ". . . ." are read from the altered test pattern data file in FIG. 8(a) and compared to the characters in row CYC2 "1 1 1 1" in history. In this case, the dot characters "." in row CYC3 indicate that the characters did not change from the characters in row CYC2. Row CYC3 is restored to "1 1 1 1" and written to the restored test pattern data file as row CYC3 as shown in FIG. 8(b). CYC2 is replaced in history by restored row CYC3 "1 1 1 1".

Next, the characters in row CYC4 ". 0 . 0" in FIG. 8 (a) are compared to the characters in row CYC3 "1 1 1 1" in history. In this case, the dot character "." in SIG1 and SIG3 in row CYC4 indicates that they are the same character as SIG1 and SIG3 in row CYC3. SIG2 and SIG4 in Row CYC4 are different from SIG2 and SIG4 in row CYC3. Row CYC4 is restored to "1 0 1 0" and written to the restored test pattern data file as row CYC4 as shown in FIG. 8(b). CYC3 is replaced in history by restored row CYC4 "1 0 1 0".

Finally, row CYC5 ". . . 1" from FIG. 8(a) is compared to the characters in row CYC4 "1 0 1 0" in history. In this case, the dot character "." in SIG1, SIG2, and SIG3 in row CYC5 indicates that the characters are the same as the characters in SIG1, SIG2, and SIG3 in row CYC4. SIG4 in row CYC5 is different from SIG4 in row CYC4. Row CYC5 is restored to "1 0 1 1" and written to the restored test pattern data file as row CYC5 as shown in FIG. 3(b). CYC4 is replaced in history by restored row CYC5 "1 0 1 1".

Having described a presently preferred embodiment of the present invention, it will be understood by those skilled in the art that many changes in construction and widely differing embodiments and applications of the invention will suggest themselves without departing from the scope of the present invention, as defined in the claims. The disclosures and the description herein are intended to be illustrative and are not in any sense limiting of the invention, defined in scope by the following claims.

What is claimed is:

1. A method for altering a data file within a computer system wherein said altering allows said data file to be stored in less storage space within said computer system, said method comprising the steps of:

(a) sequentially processing each data record in said data file to substitute a pattern character for each character in said data record when said character in said data record is identical to a correspondingly located character in a previous data record, sequentially processed immediately previous to said data record, wherein an altered data file is created; and    (b) restoring said altered data file by sequentially processing each altered data record in said altered data file to substitute a correspondingly located character found in said altered data record, sequentially processed immediately previous to each said altered data record, for each pattern character in each said altered data record of said altered data file.

2. The method of claim 1 further comprising the following step (a0), performed before step (a):

(a0) processing a first data record of said data file without altering said first data record.

3. A method for altering a data file within a computer system wherein said altering allows said data file to be stored in less storage space within said computer system, said method comprising the steps of:

(a) sequentially processing each data record in said date file to substitute a pattern character for each character in said data record when said character in said data record is identical to a correspondingly located character in a previous data record, sequentially processed immediately previous to said data record, wherein an altered data file is created; and (b) compressing said altered data file and storing said compressed altered data file on a storage device.

4. The method of claim 3 further comprising the steps of:

(c) retrieving said compressed altered data file from said storage device and decompressing said compressed altered data file wherein a recreated altered data file is created; and (d) restoring said recreated altered data file by sequentially processing each recreated altered data record in said recreated altered data file to substitute a correspondingly located character found in a previous recreated altered data record, sequentially processed immediately previous to each said recreated altered data record of said recreated altered data file for each pattern character in said recreated altered data record of said recreated altered data file.

5. The method of claim 4 further comprising the following step (d1), performed before step (d):

(d1) processing a first recreated altered data record of said recreated altered data file without altering said first recreated altered data record.

6. The method of claim 3 further comprising the following step (a0), performed before step (a):

(a0) processing a first data record of said data file without altering said first data record.

7. A method for altering a data file within a computer system to create an altered data file, wherein said altering allows said altered data file to be stored in less storage space within said computer system, said method comprising the steps of:

(a) reading a first data record of said data file into a computer memory;

(b) writing said first data record to a storage device;

(c) copying said first data record to a history area to create a history record;

(d) reading a next data record from said data file into said computer memory;

(e) comparing each character of said next data record with each character of said history record;

(f) when a character of said next data record matches a correspondingly located character of said history record, writing a predetermined pattern character to an output record at a location in said output record corresponding to a location of said character of said next data record;

(g) when a character of said next data record does not match a correspondingly located character of said history record, writing said character of said next data record to said output record at a location in said output record corresponding to a location of said character of said next data record;

(h) after all characters have been processed by step (f) and step (g), writing said output record to said storage device;

(i) copying said next data record to said history area as said history record; and (j) repeating steps (d) through (i) for each of said next data records in said data file to create said altered data file.

8. The method of claim 7 further comprising the steps of:

(k) reading a first altered data record of said altered data file into a computer memory;

(l) writing said first altered data record to said storage device;

(m) copying said first altered data record to a history area to create an altered history record;

(n) reading a next altered data record from said altered data file into said computer memory;

(o) comparing each character of said next altered data record with each character of said altered history record;

(p) when a character of said next altered data record is a predetermined pattern character, writing a correspondingly located character of said altered history record to an output record at a location in said output record corresponding to a location of said predetermined pattern character;

(q) when a character of said next altered data record is not said predetermined pattern character, writing said character of said next altered data record to said output record at said location in said output record corresponding to said location of said character of said next altered data record;

(r) after all characters of said next data records have been processed by step (p) and step (q), writing said output record to said storage device;

(s) copying said output record to said history area as said history record; and (t) repeating steps (n) through (s) for each of said next altered data records in said data file to restore said altered data file.

9. The method of claim 7 further comprising the steps of:

(k) compressing said altered data file to create a compressed altered data file and storing said compressed altered data file on said storage device.

10. The method of claim 9 further comprising the steps of:

(l) retrieving said compressed altered data file from said storage device;

(m) decompressing said compressed altered data file;

(n) reading a first altered data record of said altered data file into said computer memory;

(o) writing said first altered data record to said storage device;

(p) copying said first altered data record to a history area to create an altered history record;

(q) reading a next altered data record from said altered data file into said computer memory;

(r) comparing each character of said next altered data record with each character of said altered history record;

(s) when a character of said next altered data record is a predetermined pattern character, writing a correspondingly located character of said altered history record to an output record at a location in said output record corresponding to a location of said predetermined pattern character;

(t) when a character of said next altered data record is not a said predetermined pattern character, writing said character of said next altered data record to said output record at said location in said output record corresponding to said location of said character of said next altered data record;

(u) after all characters of said next altered data record have been processed by step (s) and step (t), writing said output record to said storage device;

(v) copying said output record to said history area as said history record;

(w) repeating steps (q) through (v) for each of said next altered data records in said data file wherein a restored altered data file is created; and (x) applying said restored altered data file to a device under test.

11. A method for altering a test pattern data file within a computer system allowing said altered test pattern data file to be stored in less storage space within said computer system, said method comprising the steps of:

(a) processing a first data record of said test pattern data file without altering said first data record;

(b) sequentially processing each remaining data record in said test pattern data file to substitute a predetermined pattern character for each character in said each remaining data record in said test pattern data file when said character in each said remaining data record is identical to a correspondingly located character in a previous data record, processed immediately previous to said each remaining data record in said test pattern data file, wherein an altered test pattern data file is created;

(c) processing a first altered data record of said altered test pattern data file without altering said first altered data record;

(d) sequentially processing each remaining altered data record in said test pattern data file to substitute a correspondingly located character found in a previous data record, sequentially processed immediately previous to said remaining altered data record of said altered test pattern data file for each predetermined pattern character in said each remaining altered data record of said altered data file, wherein a restored test pattern data file is created; and (e) applying said restored test pattern data file to a device under test.

12. The method of claim 11 further comprising the following steps (b1) and (b2) performed after step (b) and prior to step (c):

(b1) compressing said altered test pattern data file to create a compressed altered test pattern data file and storing said compressed altered test pattern data file on said storage device; and (b2) retrieving said compressed altered test pattern data file from said storage device and decompressing said compressed altered test pattern data file.

* * * * *